US006848067B2

(12) United States Patent
Perner

(10) Patent No.: US 6,848,067 B2
(45) Date of Patent: Jan. 25, 2005

(54) MULTI-PORT SCAN CHAIN REGISTER APPARATUS AND METHOD

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 434 days.

(21) Appl. No.: 10/107,939

(22) Filed: Mar. 27, 2002

(65) Prior Publication Data

US 2003/0188240 A1 Oct. 2, 2003

(51) Int. Cl.[7] .............................................. G01R 31/28
(52) U.S. Cl. ..................................... 714/729; 714/727
(58) Field of Search ............................... 365/230; 711/3; 370/401; 714/726, 727, 729

(56) References Cited

U.S. PATENT DOCUMENTS

| 4,757,477 A | * | 7/1988 | Nagayama et al. .... 365/230.05 |
| 5,197,070 A |   | 3/1993 | Maeno |
| 5,442,770 A | * | 8/1995 | Barratt .......................... 711/3 |
| 5,452,259 A | * | 9/1995 | McLaury ................ 365/230.05 |
| 5,636,228 A |   | 6/1997 | Moughanni et al. |
| 5,719,504 A |   | 2/1998 | Yamada |
| 5,867,507 A |   | 2/1999 | Beebe |
| 5,953,285 A |   | 9/1999 | Churchill et al. |
| 6,751,225 B1 | * | 6/2004 | Chung ........................ 370/401 |

FOREIGN PATENT DOCUMENTS

FR        2624631        6/1989

* cited by examiner

*Primary Examiner*—David Ton

(57) ABSTRACT

A memory apparatus, which may be of resistive cross point memory (RXPtM) cell type (one example of which is a magnetic random access memory (MRAM)) includes multiple serial data paths which are merged and may exchange data as needed by the data input/output (I/O) circuits connected to a serial I/O port. A plurality of scan path registers are connected by an array of static random access memory (SRAM) memory units of plural memory cells. The scan paths and SRAM memory units perform a parallel transfer of data from scan path registers to and from temporary registers of the SRAM memory units in order to effect parallel data exchange between the multiple scan path registers.

26 Claims, 4 Drawing Sheets

MULTI-PORT SCAN CHAIN REGISTER APPARATUS AND METHOD

BACKGROUND OF THE INVENTION

1. Field of the Invention

Figure 1:
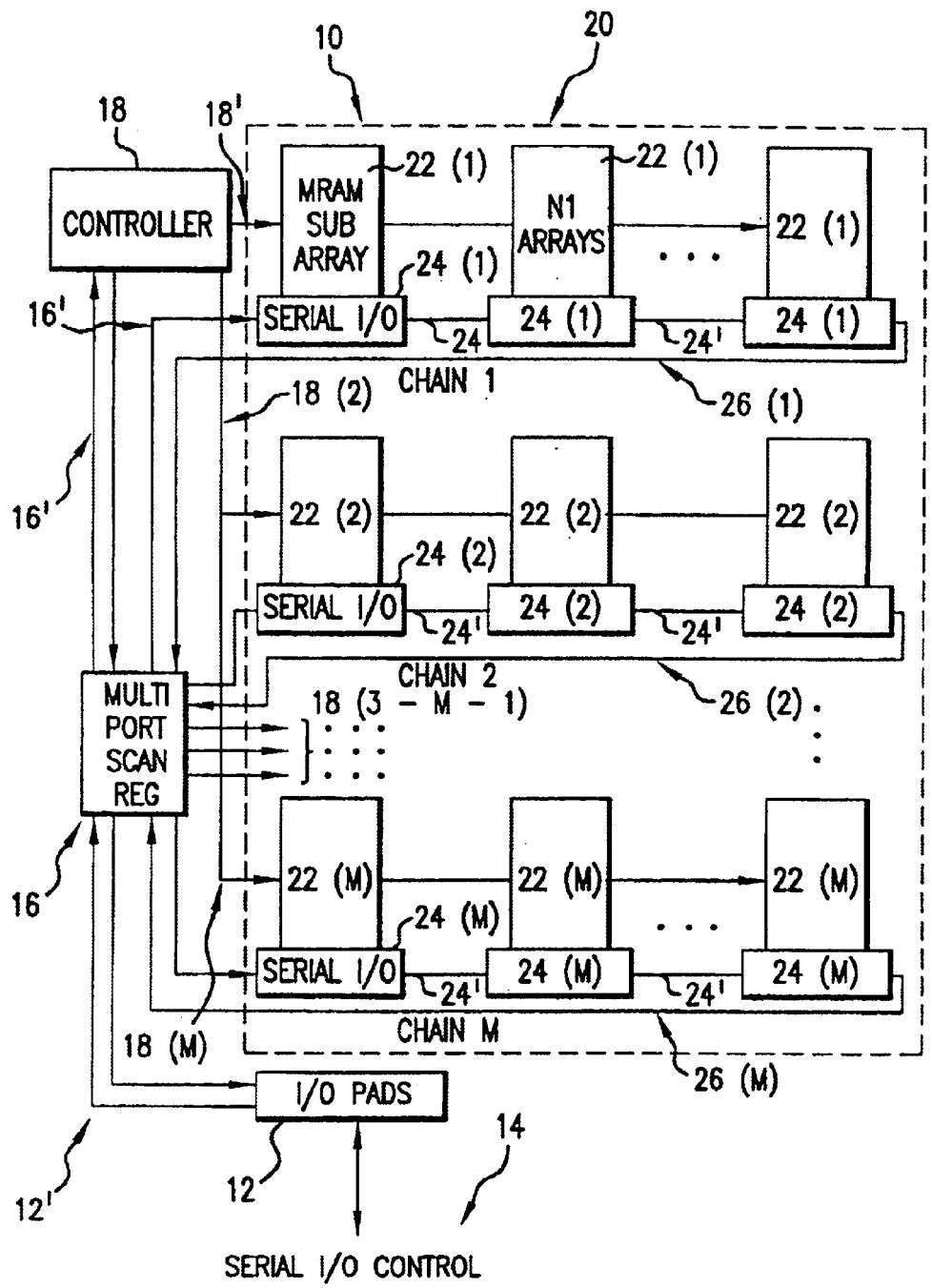

The present invention relates to devices for data storage and retrieval. Particularly, this invention relates to a memory apparatus, which may be of resistive cross point memory (RXPtM) cell type (one example of which is a magnetic random access memory (MRAM)), having multiple serial data and control paths. The multiple serial data paths are merged and may exchange data as needed by the data input/output (1/0) circuits connected to a serial I/O port. A plurality of scan path registers are connected by an array of static random access memory (SRAM) memory cells to perform a parallel transfer of data from scan path registers to and from temporary registers in the SRAM memory array in order to effect data exchange between the multiple scan path registers

2. Related Technology

A scan chain is a set of registers connected in series with a facility to shift data between the registers in the series, in order to transfer data from the one end of the scan chain to the other or to perform the function of controlling the state of the registers of the scan chain, for example. An example of the use of a scan chain is to connect the I/O pads of a chip as a facility to serially transfer control data and address data applied to the input of the chip to the memory control blocks or the memory array blocks and to serially transfer output data from the memory array or control blocks to the I/O pads of the chip. One example of a serial scan chain commonly found in digital integrated circuits is a "boundary scan chain" in which the I/O for a chip or circuit block is connected to a scan chain to provide the option to extract the I/O in parallel or to extract the I/O in a serial manner by shifting the I/O to a single output port through the "boundary scan chain."

Another form of boundary scan chain connects the parallel control and I/O functions of a system block to a small set of serial data ports. Scan chains may also be found in digital logic systems connecting all the registers of the system together as part of a scan test system. One example of a system that may contain many control and data scan chains is an MRAM memory. Such an MRAM memory would be a complete device, including system controls, with multiple local data I/O scan chains connecting together sub-blocks of the MRAM memory cell arrays, and a scan chain to connect the system I/O ports.

Prior solutions to the problem of exchanging data between plural scan chain registers have required custom designed logic circuits to perform the function of moving data from one scan chain to another. This conventional solution disadvantageously requires custom logic circuit to be designed for each application. Further, for a minimal configuration of coupling two scan chains the conventional solution may be a reasonable solution. However, for when more than two scan chains are to be coupled, then there is a need for more temporary storage as part of the scan chain data exchange circuitry. In this context, the conventional solution becomes much too complex to be practicable.

Examples of prior technology that may be relevant to the present invention are seen in U.S. Pat. No. 5,197,070, issued 23 Mar. 1993 to Hideshi Maeno; U.S. Pat. No. 5,636,228, issued 3 Jun. 1997 to Claude Moughanni, et al.; U.S. Pat. No. 5,719,504, issued 17 Feb. 1998 to Shtaka Yamada; and particularly in U.S. Pat. No. 5,953,285, issued 14 Sep. 1999 to Jonathan E. Churchill, et al. U.S. Pat. No. 5,197,070 (Maeno) is believed to use a scan path with multiple registers to affect a test function in a memory. U.S. Pat. No. 5,636,228 (Moughanni) appears to describe a tri-stateable scan register to aid in freeing up the scan chain while controlling the data output from a circuit. U.S. Pat. No. 5,719,504 (Yamada) is believed to describe a register (flip-flop) found in combinational logic that may be serially connected in a scan chain for the purpose of storing the state of the registers and allowing the contents of the registers to be shifted in and out of the circuit using a scan chain. Finally, U.S. Pat. No. 5,953,285 (Churchill) is believed to describe a control register as an interface to a memory circuit and features synchronous or asynchronous modes of operation where the register may contain a scan register.

Further, Magnetic Random Access Memory ("MRAM") is a non-volatile memory that is being considered for long term data storage. A typical MRAM device includes an array of memory cells. Word lines extend along rows of the memory cells, and bit lines extend along columns of the memory cells. The memory cells are each located at a cross point of a word line and a bit line, and each memory cell includes two masses of magnetic material. One of the masses is magnetically fixed and the other is magnetically variable. A memory cell stores a bit of information as the orientation of relative magnetization of the fixed and variable materials. In other words, the magnetization of each memory cell at any given time assumes one of two stable orientations. These two stable orientations. referred to as "parallel" and "anti-parallel" magnetic orientation, represent logic values of '0' and '1,' for example. The resistance of a memory cell varies dependent upon whether it stores a "0" or a "1" value. That is, the resistance of a memory cell is a first value "R" if the orientation of the magnetization of the fixed magnetic material and of the variable magnetic material is parallel, and the resistance of the memory cell is increased to a second value R+DR if the orientation of the magnetization is anti-parallel. The orientation of the relative magnetization of a selected memory cell (and, therefore. the logic state of the memory cell) may be sensed by sensing the resistance value of the selected memory cell.

Thus, although the present invention is not so limited, an implementation of this invention may utilize MRAM memory. That is, an example of this invention may be implemented in an MRAM memory device, which memory device has control and data scan chains, as mentioned above.

Also in view of the above, it appears that there is a need for an effective and efficient solution for coupling multiple scan chains with the possibility of adding varying amounts of extra storage memory for exchanging data between the scan chains by providing a SRAM memory array at the junction of the multiple scan chains.

SUMMARY OF THE INVENTION

In view of the deficiencies of the conventional technology, an objective for this invention is to reduce or overcome one or more of these deficiencies.

According to one aspect of the present invention, multiple scan chain registers are combined with an SRAM memory to perform a parallel transfer of data from scan path registers to temporary storage in the SRAM memory and to another of the plural scan chain registers in a process to exchange data between the multiple scan chain registers.

According to one implementation of the present invention, MRAM memory sub-arrays have an access time interval that is sufficiently long that relatively long data scan chains can be parallel loaded during a memory sub-array access interval. By accessing a large number of sub-arrays in parallel, a higher level of data transfer performance may be achieved in such a memory device.

Moreover, the present invention discloses a register-based circuit for exchanging data between several scan chains, at lease one of which may interface with the I/O circuits for outputting data.

The present invention also provides a method of exchanging data among plural scan chains. The scan chains may be static during the data exchange, but more preferably are dynamic during the data exchange. Embodiments of the present invention provide for dynamic operation of the scan chains even while data is exchanged and shared among the plural scan chains.

Other aspects and advantages of the present invention will become apparent from the following detailed description, taken in conjunction with the accompanying drawings, illustrating by way of example the principles of the present invention.

BRIEF DESCRIPTION OF THE DRAWING FIGURES

Figure 2:
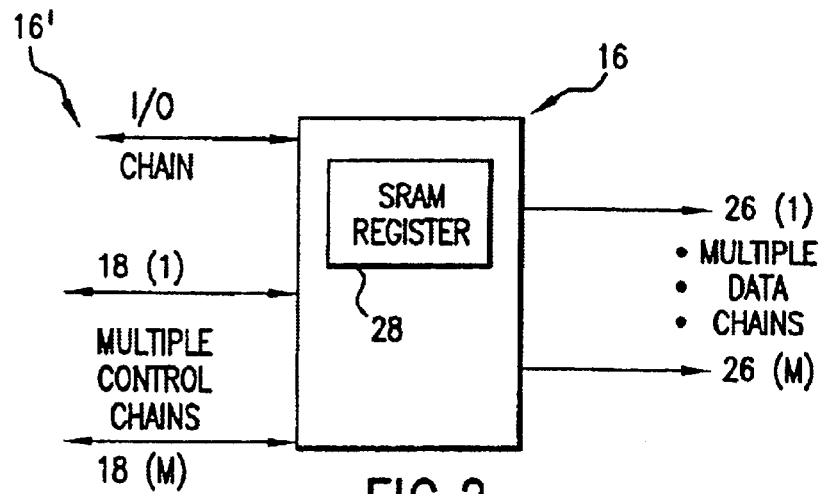
Figure 3:
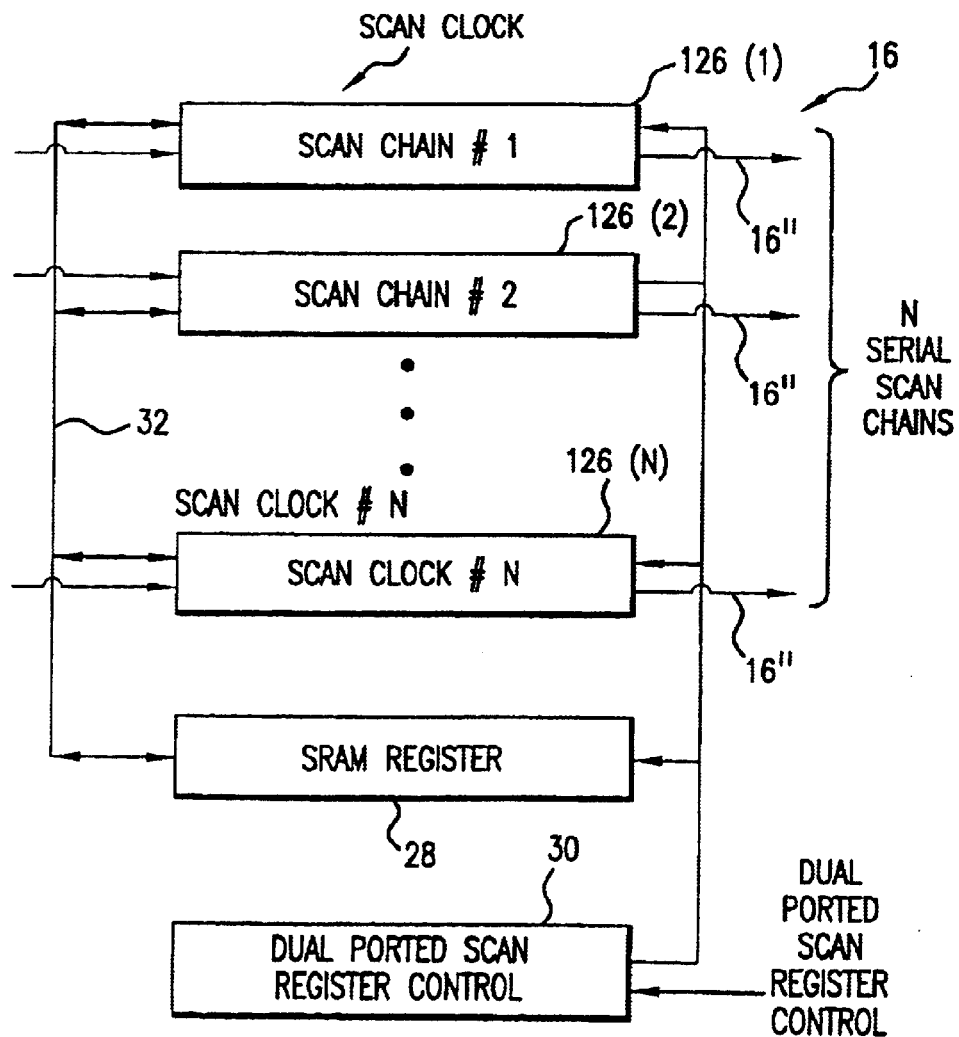
Figure 4:
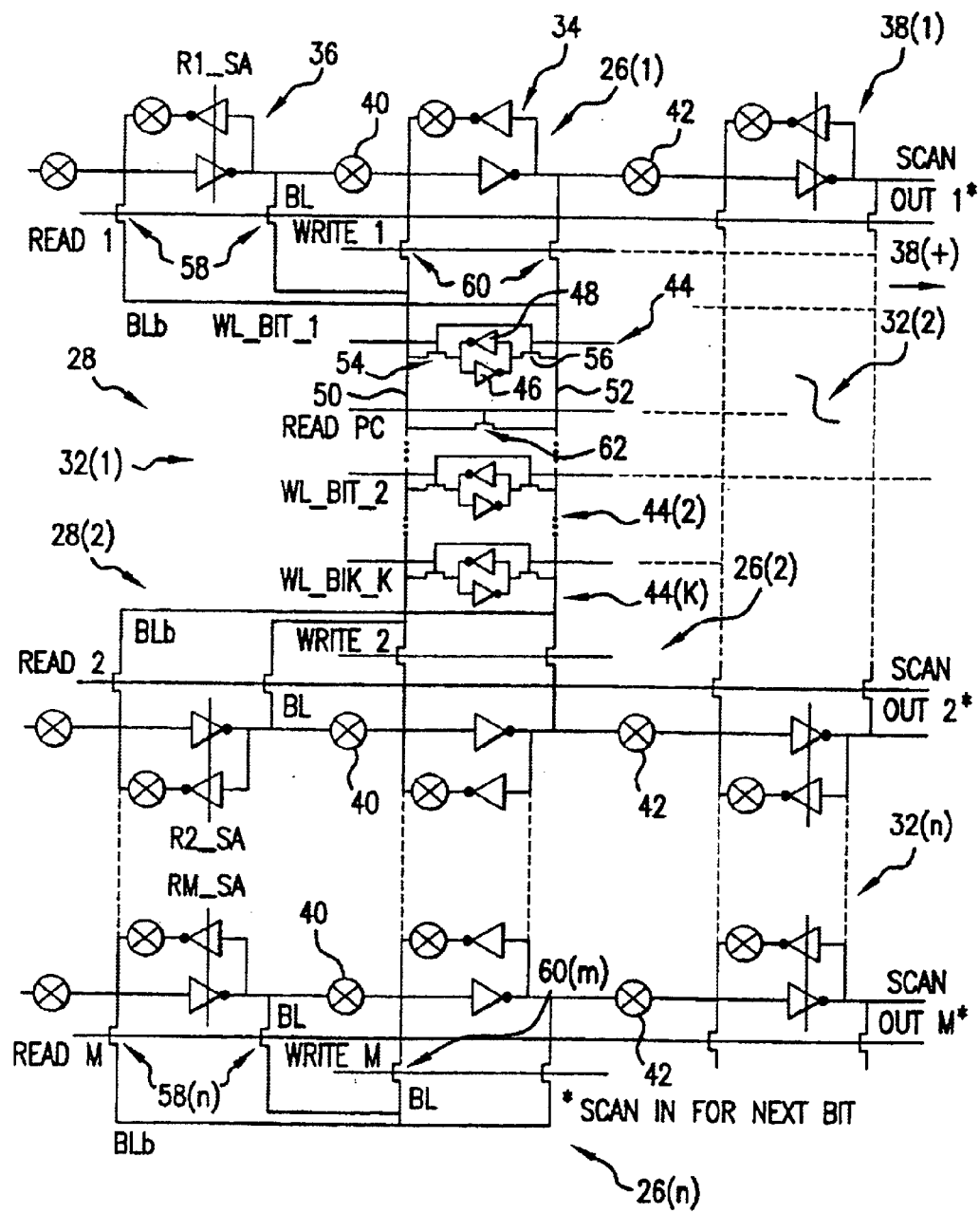
Figure 5:
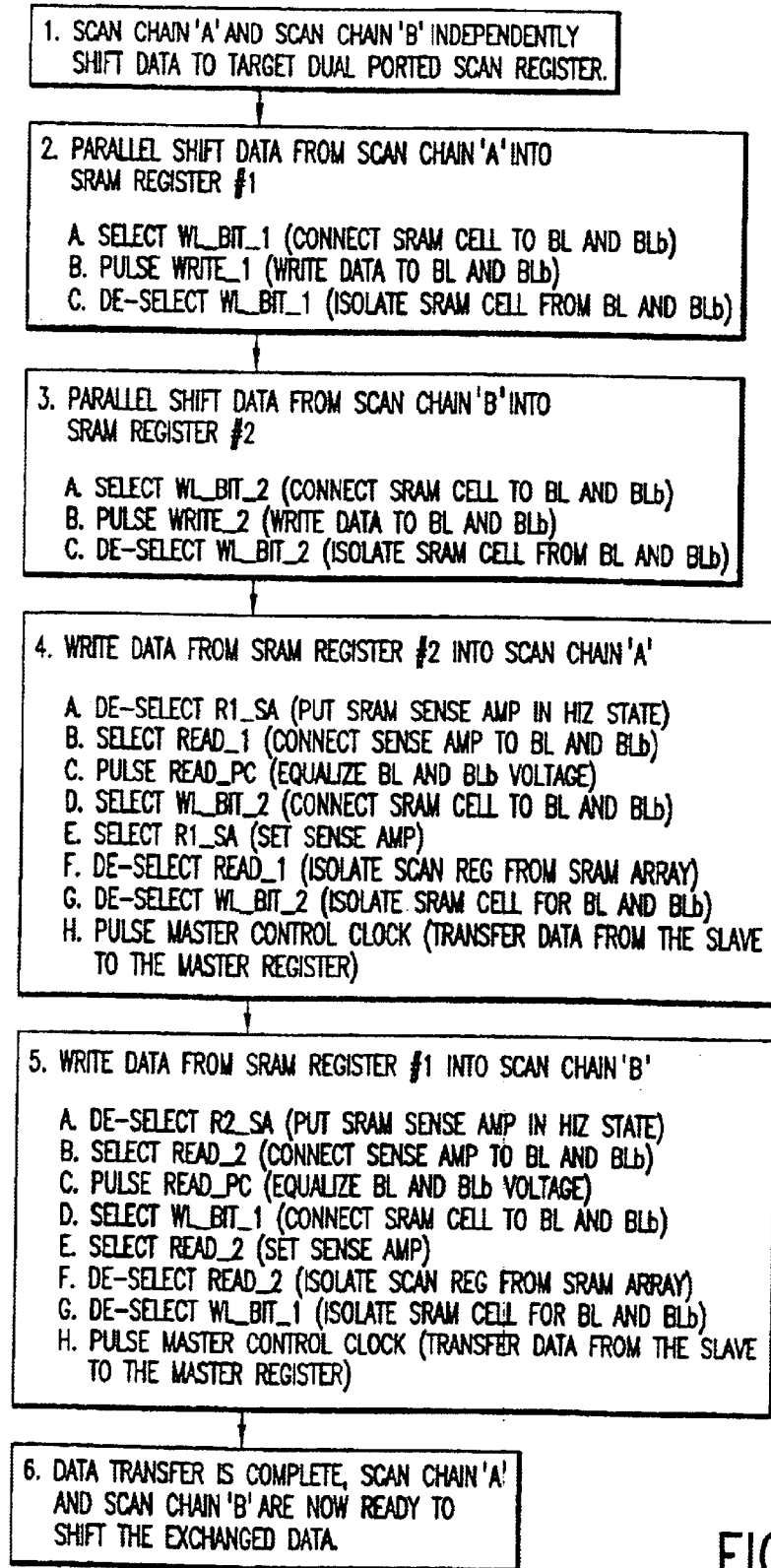

FIG. 1 is a very generalized schematic illustration of a memory device embodying the present invention;

FIG. 2 schematically illustrates a portion of the memory device seen in FIG. 1;

FIG. 3 schematically illustrates the portion of the memory device seen in FIGS. 1 and 2, and is presented in greater detail;

FIG. 4 is a more particularized illustration of the device architecture shown in FIG. 3; and FIG. 5 is a graphical illustration or process flow chart illustrating events and actions in a process of implementing the present invention.

DETAILED DESCRIPTION OF AN EXEMPLARY PREFERRED EMBODIMENT OF THE INVENTION

The present invention provides a method and apparatus for exchanging data between multiple scan chains. One example of an implementation of this invention is an SRAM memory device, which includes the I/O data paths from a group of MRAM memory arrays, a set of SRAM registers, and in input/output (I/O) controller. However, other types of devices and other types of memory besides SRAM may be implemented according to the present invention.

Importantly, the present invention allows multiple serial data paths to merge and to exchange data as needed by the data input/output (1/0) circuits controlling multiple active memory blocks or units, which are connected to a serial I/O port.

Viewing FIG. 1, a MRAM memory device 10 is very generally depicted. This device may be considered to have a "size" indicated by the arbitrary numbers N×M, in which N and M are respectively indicative of the number of MRAM sub-arrays in a row of the device, and the number of such rows of MRAM sub-arrays, as will be further explained below. That is, the device 10 illustrated in FIG. 1 is of indeterminate size, and devices of various sizes may be implemented by the invention. The invention is not limited to the implementation of memory devices of any particular size. Nor is the invention limited to the implementation of a memory device. This particular exemplary MRAM device 10 includes an array of contact pads 12, generally depicted as an I/O port at which serial data and control information 14 (indicated by the arrow and legend on FIG. 1) is exchanged.

Data and control information exchanged via the I/O port 12 is routed via a connection 12' to and from a multi-ported scan register (MPSR) block 16, with the control information being further routed via a connection 16' to and from a controller 18. The controller 18 has plural connections 18', as is further explained below, each also having a parenthetical suffix indicative of the respective row connection into a N×M memory array, as will be further explained below.

The multi-ported scan register block 16 and controller 18 respectively control flow of data and control information to and from an N×M array 20 of MRAM memory sub-arrays, each sub-array being indicated with the numeral 22 (i.e., with a parenthetical suffix number 1 through M indicating the row of the memory sub-array (e.g., 22(1) through 22(M)). The connections between MPSR 16 and the sub-arrays 22 are indicated on FIG. 1 by the numerals 16". By way of example. and without limitation, each MRAM sub-array 22 may have a capability of sensing 2 bytes of data with one memory access. That is, during a single memory access interval, each of the N×M sub-arrays 22 may sense 2 bytes of data.

Turning now to FIG. 2 (which generally illustrates the architecture of a multi-ported scan register (MPSR) 16 in combination with FIG. 1), it is seen that data scan chains having serial I/O parts 24 (best seen in FIG. 1) and interconnections 24' may be used to convey the 2 bytes of data in a serial manner (via the interconnected respective serial I/O parts 24 and interconnections 24') through a number of the MRAM sub-arrays 22 (i.e., through "N" sub-arrays of a row) to form one data scan chain 26. The plural scan chains of the "M" rows are indicated respectively with the numerals 26(1) through 26(M). Further, the number "M" of scan chains may be connected via the multi-ported scan chain register (MPSR) block 16, and the number "M" could be (for example) 16 or 32, so that the data scan chain may respectively convey 32 or 64 bytes of data during a single MRAM access interval.

Further, there may be several data scan chains 26 with each MRAM sub-array (although only a representative single scan chain is shown in FIG. 1 ). In FIG. 1, the number "N" could also be (for example) 16 or 32. Thus, the multi-ported scan chain register block 16 will need to manage data from "N.' data chains, as well as control chains 18(1) through 18(M), and the serial I/O chain effecting connection 16' (viewing FIG. 2 in particular). It will be seen in FIG. 2 that MPSR 16 includes an especially configured SRAM facility 28, which is further described below. By its special configuration, the SRAM facility 28 provides for parallel reading of data from selected places in a scan chain, and writing of this data into a different selected place in the scan chain, as is further described below.

Thus, the present invention provides a method and apparatus to solve this routing problem for data and control information, and is presented in the context of an MRAM memory device, although it is noted once again that the invention is not so limited.

Thus, turning now to FIG. 3, the architecture of the multi-ported scan register (MPSR) 16 is illustrated in greater detail, It is seen that this MPSR 16 includes portions of the serial scan chains 26 (which portions are indicated on FIG. 3 with the numeral 126 also having a parenthetical suffix added which corresponds to those suffixes of FIGS. 1 and 2.

The MPSR 16 also includes the especially configured SRAM facility 28, and a dual ported scan register control 30. A parallel connection 32 (one of plural being illustrated in detail—see the parenthetical suffixes) provides for parallel data exchange between selected scan chains (i.e., 26(1) thru 26(M)), and the SRAM facility 28, which also may be referred to as a register.

Turning now to FIG. 4, it is seen that three exemplary (i.e., of the plural 1 through M) scan chains 26 are illustrated as they are connected by an representative illustrated part of the especially configured SRAM register 28. The illustrated part of each scan register in the scan chains 26(1), 26(2), through 26(n) includes two registers, a master register 34, and a slave register 36. These two registers 34 and 36 work together to move data through a serial string of scan register portions 38 (the first being indicated, and subsequent register portions being indicated by the rightwardly directed arrows on FIG. 4 and the reference character 38(+). This data movement through the register portions is effected by pulsing non-overlapping respective clocks, indicated as master clock 40, and slave clock 42 (connection points for these clock signals being indicated). It is noted on FIG. 4 that additional respective pairs of such non-overlapping clock connections are indicated for the additional scan chains through the number "N" of the array.

Each scan register portion 34 is associated with a plurality of SRAM memory cells 44, the number of memory cells 44 in a SRAM register portion depending on the number of the data words to be moved between the scan register portions 34. Thus, the depth of the plurality of memory cells 44 illustrated in FIG. 4 is exemplary only, and is not a limitation on the invention. Accordingly, these plural memory cells are indicated with characters 44(1) through 44(k), where "k" in this case indicates the number of memory cells in the SRAM register associated with each portion of the scan chain register 34. Each memory cell 44 includes a pair of cross-coupled inverters 46, 48 (only one of the cells being so referenced in FIG. 4 because of space limitations on the drawing FIG. 4) respectively connected to a pair of bit lines 50, 52 through a pair of select transistors 54, 56 (again, only a pair of each out of a large plurality being so referenced on FIG. 4 because of space limitations on the drawing FIG. 4). Data is written into a selected SRAM memory cell from a selected scan chain containing the master register 34 through select transistors 54 and 56 and select transistors 60. And, data is written into a selected scan chain slave register 36 from a selected SRAM memory cell 44 through select transistors 54 and 56 and select transistors 58. That is, the read operation transistors with gate controls labeled 'read 1," "read 2," through "read M" applied to the gates of transistors 58 while the inverters in the slave register are clocked to a high impedance state with signals labeled R1__SA, R2__SA, through RM__SA, in FIG. 4 pass data from a selected SRAM memory cell 44 to a selected scan chain slave register 36. And, the write transistors 60 with gate controls labeled "write 1," "write 2," through "write M," on FIG. 4 pass data from the selected scan chain master register 34 to a selected SRAM memory cell 44.

The basic SRAM memory circuit of FIG. 4 includes SRAM memory cells, and decoders, as will be seen. In this invention the decoder circuits are configured to connect selected SRAM memory cells to selected scan chains. Data is read from one portion of the selected scan chains (i.e., the master registers 34) and is written in a different portion of the selected scan chains (i.e., into the slave registers 36). Reading data from an SRAM employs a clocked slave register to switch the slave register inverters (i.e., inverters are not referenced individually in FIG. 4, but are shown as part of the slave scan register 36, and they are clocked inverters with the control signals R1__SA, R2__SA, through RM__SA) into a high impedance state. Then the SRAM bit lines 50 and 52 are equalized (i.e., by temporarily switching transistor 62 to a conductive state and then back to a non-conductive state) to prevent stored charge on the slave register from disrupting the data stored in the SRAM memory cell 44 being read, then the word line on the selected row of the SRAM cells is asserted (i.e., by turning on transistors 54 and 56). The SRAM data is thus placed on the bit lines that are connected to the selected slave register 36 through transistors 58. This data signal at this point may be only a small differential voltage depending on values of the circuit elements. However, the clock on the slave registers then turns on the slave register inverters (i.e., switches them to a low impedance state). Thus, the differential voltage on the slave register is amplified to a full logic value signal, completing the read operation.

In view of the above. it is to be understood that a minimum of one SRAM unit is required in order to exchange data between two scan chains if the scan chains are held static (i.e., no scan shifting is allowed during the data exchange). On the other hand, a circuit with a minimum of two SRAM memory units will allow data to be exchanged between two scan chains even though one of the two chains is allowed to shift data during the data exchange operation effected via these two SRAM memory units. In a similar manner, if three independent scan chain registers are configured to exchange data among them, then there may be a need to provide nine (9) SRAM memory units linking these three scan chain registers. Accordingly, in the illustration of FIG. 4, it will be appreciated that in the same sense as the number of scan chains 26 is indeterminate (and is variable at choice), then the number of SRAM memory units 44 linking these scan chains 26 is indeterminate and is variable at choice. The number of SRAM memory units 44 utilized will depend in part on the degree of freedom it is wished to achieve and allow for the interconnected scan chains to shift data during a data sharing (i.e., data exchanging operation) among the plurality of scan chains 26. Further, the depth of the SRAM cells 44 may exceed the length of the data words to be transferred in order to allow the SRAM cells to provide a greater volume of data storage. The stored data in the SRAM cells 44 is actually data that is in the process of being shared among the scan chains 26.

Thus, this greater storage capacity (i.e., when the number of SRAM cells 44 exceeds the length of the data words) could be used to permit multiple passes of one scan chain (i.e., internal memory I/O) to load data from multiple data accesses into temporary SRAM storage for transfer to memory I/O ports (recalling I/O port 24 of FIG. 1) at a time shifted so that a host device is then ready to receive the data from the memory unit 10. An alternative use of such an extra depth (i.e., greater depth than the length of the data words) of temporary storage in the SRAM cells 44 effected in the SRAM units interconnecting scan chains 26 could be to hold pre-loaded data that may be frequently read into the memory unit 10 (BIST data, for example). The number of extra SRAM memory units 44 that are added to the scan chain registers 26 is limited only by the performance of the memory unit 10 which is desired, and by the data transfer performance of the scan registers (i.e., in the case of MRAM memory being employed). The maximum number of SRAM memory units 44 is currently estimated to be about one thousand (1000), although this should not be considered as a limitation on the invention because the performance of various types of memory devices, including MRAM memory, is improving, and is expected to further improve in the future.

Turning now to FIG. 5, this flow chart shows the steps in exchanging a pair of data bits between two exemplary scan chain registers. Rather than reiterate here each step and sub-step of the process illustrated in FIG. 5, the reader is directed to this Figure, and only highlights are discussed in greater detail immediately below.

Step one (1) of FIG. 5 explains that the scan chains (here identified as Scan Chain A, and as Scan Chain B) each independently shift the data bits to be exchanged to respective ports (i.e., interfaces of the respective scan chain register with a SRAM memory unit).

In step two (2) of FIG. 5, the "A" scan chain shifts the respective data in parallel into a selected row of a connecting SRAM memory unit. Considering Step (2) of FIG. 5, it is seen that this shifting of the date in parallel for each bit involves the use of three sub-steps, labeled (a), (b), and (c). These sub-steps are articulated both in flow charting short hand, and in abbreviated plain language on FIG. 5. Sub-step (a) involves the connection of a selected SRAM cell to bit line (BL on FIG. 4) and bit line b (BLb on FIG. 4). Sub-step (b) is that actual writing of the data bit value to these bit lines, and hence into the SRAM register. Sub-step (c) de-selects the bit lines BL and BLb (recalling the explanation of FIG. 4 again).

Similarly, in step three (3) of FIG. 5, the "B" scan chain shifts its respective data in parallel into another row of the connecting SRAM memory unit.

Consequently, steps four (4) and five (5) of FIG. 5 explain that the connecting SRAM memory units later write the respective data bits into the recipient scan chains (i.e., the data bit from scan chain "A" is written into scan chain "B," and the data bit from scan chain "B" is written into scan chain "A"). It is to be noted that in the abbreviated plain language text of FIG. 5, step 4, sub-step (a), the term "HIZ" means "high impedance" (recall the explanation above of how data is written to a slave register 36 of selected SRAM memory cell 44 through select transistors 54 and 56 and select transistors 58, while the inverters in the slave register are clocked to a high impedance state with signals R1_SA, R2_SA, through RM_SA).

Those ordinarily skilled in the pertinent arts will understand that depending upon the number of bits in a digital word that is to be transferred from one scan chain to another, the number of connecting SRAM memory units will vary also. Additionally, there may be extra SRAM memory cells provided, as is explained above. Further, depending on the depth of the SRAM memory units in their connection between scan chains, the data bits may be shifted a number of times along the connecting SRAM memory cells before they reach the interface with the recipient scan chain and are then written into the recipient scan chain. This "expansibility" or pluralism of both the scan chains 26 and of the connecting SRAM memory units 44 was explained above.

Accordingly, those ordinarily skilled in the pertinent arts will understand that the invention is subject to modification and change in accord with the spirit and scope of the description and disclosure above. Although reference is made to a particularly preferred embodiment of the invention, such reference does not imply a limitation on the invention, and no such limitation is to be inferred. Further, the invention is not limited to the specific embodiments described and illustrated above. Instead, the invention is to be construed according to the claims that follow, which provide a definition of the invention.

I claim:
1. A data exchange device, said device comprising:
  a plurality of scan chains, each of said scan chains including a plurality of registers capable of storing data bits, and said plurality of registers including master registers and slave registers; and
  an array of plural static random access memory (SRAM) cells interconnecting said plurality of scan chains, said array of plural SRAM memory cells receiving data bits from selected ones of said master registers, and writing said data bits to selected ones of said slave registers.

2. The data exchange device of claim 1, including a parallel data interconnection between said plurality of scan chains and said array of SRAM memory cells.

3. The data exchange device of claim 1 wherein each SRAM memory cell of said array of SRAM memory cells includes a pair of inverters, which pair of inverters are cross coupled with one another.

4. The data exchange device of claim 3 wherein each SRAM memory cell of said array of SRAM memory cells includes a pair of select switches, one of said pair of select switches connecting to one side of said pair of cross coupled inverters, and the other of said pair of select switches connecting to the opposite side of said pair of cross coupled inverters.

5. The data exchange device of claim 4 wherein each of said pair of select switches includes a transistor.

6. The data exchange device of claim 4 also includes an equalization switch connecting across said pair of cross coupled inverters and across said pair of select switches of an SRAM memory cell.

7. The data exchange device of claim 7 wherein said equalization switch includes a transistor.

8. The data exchange device of claim 3 further including a pair of write switches having a common switch closure control connection, and each of said pair of write switches connecting a respective one side of said pair of cross coupled inverters to a respective side of a register of one of said pair of said scan chains.

9. The data exchange device of claim 8 wherein said pair of write switches connect to a master register of said one scan chain.

10. The data exchange device of claim 8 wherein said pair of write switches each include a transistor, and said switch closure control connection includes a connection to a base of said transistor.

11. The data exchange device of claim 3 further including a pair of read switches having a common switch closure control connection, and each of said pair of read switches connecting a respective one side of said pair of cross coupled inverters to a respective side of a register of one of said pair of said scan chains.

12. The data exchange device of claim 11 wherein said pair of read switches connect to a slave register of said one scan chain.

13. The data exchange device of claim 12 wherein said pair of read switches each include a transistor, and said switch closure control connection includes a connection to a base of said transistor.

14. The data exchange device of claim 1 further including a pair of non-overlapping and sequentially-pulsing data transfer control clocks, said pair of data transfer control clocks providing sequential non-overlapping clock pulses to one or more of said plurality of scan chains, whereby on alternating sequential clock pulses provided by said pair of non-overlapping clocks selected registers of said plurality of registers of one or more of said plurality of scan chains exchange selected data bits.

15. The data exchange device of claim 14, wherein upon a determined first of said sequential non-overlapping clock pulses data bits are exchanged from a selected master register of a scan chain, and then on a next-subsequent of said sequential non-overlapping clock pulses data bits are exchanged from a selected slave register of a scan chain.

16. The data exchange device of claim 1 in which said array of plural SRAM memory cells has a depth at least equal to a data word length.

17. A method of data exchange between plural scan chains, said method including steps of:
providing plural scan chains, each of said plural scan chains including a plurality of registers each capable of storing data bits, and providing for said plurality of registers to include plural master registers alternating along each scan chain with plural slave registers;
providing an array of static random access memory (SRAM) cells interconnecting said plurality of registers: and
providing for said array of SRAM memory cells to receive data bits from selected ones of said master registers, and to write said data bits to selected ones of said slave registers.

18. The method of claim 17 further including the steps of providing for said array of SRAM memory cells to have a depth of plural memory cells interconnecting in columns between plural scan chains arranged in rows, and providing for said depth of said plural memory cells to be equal to or greater than a size in data bits of a digital data word exchanged between said scan chains.

19. A device to exchange data between plural scan chains, said device comprising in combination:
a multi-ported scan register, said multi-ported scan register including:
a portion of each of said plural scan chains;
a static random access memory (SRAM) register including an array of SRAM memory cells interconnecting said portions of said plural scan chains; and
a multi-ported scan register control.

20. The device of claim 19 wherein said SRAM register includes an array of plural SRAM memory cells, said array of SRAM memory cells having a depth of plural SRAM memory cells in a column extending between respective portions of said scan chains arranged in rows, said depth of plural SRAM memory cells being at least equal in number of SRAM memory cells to the number of bits in a digital word to be exchanged between said scan chains.

21. The device of claim 20 wherein said portion of said plural scan chains includes a plurality of registers, said registers being arranged as a plurality of master registers and as a plurality of slave registers, said master registers and said slave registers individually alternating with one another along each respective portion of said plural scan chains.

22. The device of claim 19 wherein said multi-ported scan register control provides for data bits to be alternatingly transferred first from a master register of one of said plural scan chain portions to a selected one of said plural SRAM memory cells, and then to be transferred from said selected one of said plural SRAM memory cells either to a selected slave register of one of said plural scan chain portions or to another selected one of said plural SRAM memory cells.

23. A memory device comprising:
a core memory;
an input/output serial port for input of data and addresses to said core memory, and for output of data from said core memory;
plural scan chains each with plural registers for shifting data bits, said plural scan chains each including alternating master registers and slave registers; and
at least one static random access memory (SRAM) unit communicating between plural said plural scan chains and between plural registers thereof for communicating data bits therebetween, said SRAM unit including plural memory units, each capable of receiving a data bit from a selected master register of a connected scan chain and of writing the data bit to a selected slave register of a connected scan chain.

24. The memory device of claim 23, wherein said plural SRAM memory cells each include a memory cell of static random access (SRAM) type.

25. The memory device of claim 23 wherein each of said scan chain registers includes: two registers, said two registers including a master register, and a slave register; each of said scan chain registers also receiving clock signals from a non-overlapping master clock and slave clock.

26. The memory device of claim 23, further including each of said plurality of SRAM memory cells including plural cross coupled inverters, each of said pair of cross coupled inverters being selected by a respective one of plural select transistors to receive a data bit from a selected one of one of said plurality of scan chain registers or from another one of said plurality of SRAM memory cells.

* * * * *